United States Patent
Lu et al.

(10) Patent No.: US 8,447,249 B1
(45) Date of Patent: May 21, 2013

(54) SYSTEM AND METHOD FOR PROVIDING OPEN LOOP TRANSMIT POWER CONTROL

(75) Inventors: Tuofu Lu, Fremont, CA (US); Kai Shi, Sunnyvale, CA (US); Richard T. Chang, Sunnyvale, CA (US); Sang-Min Lee, Palo Alto, CA (US); Joe I. Jamp, Los Altos, CA (US); Paul J. Husted, San Jose, CA (US); Praveen Dua, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 13/043,882

(22) Filed: Mar. 9, 2011

Related U.S. Application Data

(60) Provisional application No. 61/355,263, filed on Jun. 16, 2010.

(51) Int. Cl.
*H04B 1/04* (2006.01)

(52) U.S. Cl.
USPC .............. 455/127.2; 455/127.1; 455/127.3; 455/115.1; 455/114.3; 375/297

(58) Field of Classification Search
USPC .......... 455/127.2, 127.1, 127.3, 115.1, 114.3; 375/297
See application file for complete search history.

(56) References Cited

U.S. PATENT DOCUMENTS

| | | | |
|---|---|---|---|
| 7,139,534 B2 * | 11/2006 | Tanabe et al. | 455/108 |
| 7,684,760 B2 * | 3/2010 | Kwak | 455/69 |
| 8,229,373 B2 * | 7/2012 | Tanoue et al. | 455/127.1 |
| 2005/0227646 A1 * | 10/2005 | Yamazaki et al. | 455/127.3 |
| 2009/0325517 A1 * | 12/2009 | Fan | 455/127.2 |

* cited by examiner

*Primary Examiner* — Sanh Phu
(74) *Attorney, Agent, or Firm* — Bay Area Technology Law Group PC

(57) ABSTRACT

This disclosure is directed to systems and methods that provide control of transmitted signal power that do not require the use of an external power detector. By determining the expected transmit power based upon conditions such as temperature or voltage, the settings of the transmitters amplifier can be adjusted to more closely match the desired transmit power.

21 Claims, 3 Drawing Sheets

SYSTEM AND METHOD FOR PROVIDING OPEN LOOP TRANSMIT POWER CONTROL

RELATED APPLICATIONS

This application relies on provisional application Ser. No. 61/355,263 filed on Jun. 16, 2010.

FIELD OF THE PRESENT INVENTION

The present disclosure generally relates to wireless communications and more particularly relates to systems and methods for controlling the amplification of transmitted wireless signals to optimize performance.

BACKGROUND OF THE INVENTION

Conventional wireless transmitters generally include a mix of digital and analog components. Typically, a digital baseband modulates the signal into a passband for analog amplification and transmission. To achieve a desired level of performance, it is often necessary to adjust the power at which the signal is transmitted. Although increasing signal power can improve reception, maximizing power is not always desirable. For example, Federal Communications Commission (FCC) regulations cap permissible transmit powers. Further, in Bluetooth applications, error vector magnitude (EVM) and adjacent channel power (ACP) metrics can be degraded when transmit power is too great. One technique for controlling the signal transmission power is to provide a gain table that correlates transmission power with the parameters necessary to control the amplifier and related analog components. Thus, once a desired transmit power is determined, the baseband will lookup the appropriate parameters from the gain table and apply them to the transmitter.

As one of skill in the art will recognize, the behavior of analog components varies depending upon environmental conditions, such as temperature. If these variations are too great, the signal will not be transmitted at the desired power and performance of the system will suffer.

One method for compensating for variations in analog performance is to use an external power detector to monitor the transmitted signal power. By comparing the difference between the measured transmit power from the external power detector and the desired power, the baseband can adjust its access to the gain table to drive transmitted power closer to the desired power. Such methods are generally known as closed loop power control.

Despite the advantages of providing direct information about the transmitted power, the necessity of supplying an external power detector adds to the cost and complexity of the hardware. Indeed, the costs associated with wireless integrated circuits have decreased to the point at which the external power detector represents a significant fraction of the expense. Further, the addition of the parameters associated with the difference between measured power and desired power increases the size of the gain table significantly, requiring greater onboard memory and slowing access to the table.

Accordingly, what has been needed is a system and method for controlling transmit power in communication systems that avoids the need for an external power detector. Similarly, there is a need for a system and method of controlling transmit power that compensates for environmental variations, such as temperature, to produce a transmit signal at a desired power level. This disclosure is directed to these and other needs.

SUMMARY OF THE INVENTION

In accordance with the above needs and those that will be mentioned and will become apparent below, this disclosure is directed to a method for controlling transmit power in a transmitter including the steps of providing a transmitter having a digital baseband portion with an analog amplifier and an environmental sensor, sampling a condition with the environmental sensor, determining a gain correction value to achieve a desired transmit power based on information from the environmental sensor, adjusting parameters of the analog amplifier on the basis of the gain correction value, and transmitting a signal using the adjusted parameters of the analog amplifier. Preferably, the environmental condition sampled is temperature. Also preferably, sampling the environmental condition occurs during operation of a power amplifier of the transmitter.

One aspect of the disclosure is directed to a transmitter that also includes a voltage sensor, further comprising the step of sampling a voltage and wherein the step of determining a gain correction value is further based upon information from the voltage sensor. In the noted embodiments, the transmitter may further include an analog to digital converter connected to the environmental sensor and the voltage sensor and wherein the steps of sampling an environmental condition and voltage comprise the baseband configuring the analog to digital converter to receive input from the environmental sensor and the voltage sensor. Preferably, the baseband communicates with the analog to digital converter using a asynchronous handshaking protocol.

In certain embodiments, the step of determining a gain correction value includes subtracting a gain correction factor, a thermal correction factor and a voltage correction factor from the desired transmit power. Preferably, the thermal correction factor and the voltage correction factor are based upon a plurality of coefficients determined for each transmit chain.

Another aspect of the disclosure is directed to a transmitter configured to have a plurality of power settings so that the step of adjusting the analog amplifier parameters involves switching from a first power setting to a second power setting based upon the gain correction value. Preferably, switching from a first power setting to a second power setting occurs when the gain correction value is greater than approximately half the difference between adjacent power settings.

This disclosure is also directed to a transmitter having a digital baseband portion including an analog amplifier and an environmental sensor; wherein the transmitter is configured to sample a condition with the environmental sensor, determine a gain correction value to achieve a desired transmit power based on information from the environmental sensor, adjust parameters of the analog amplifier on the basis of the gain correction value, and transmit a signal using the adjusted parameters of the analog amplifier. Preferably, the environmental condition sampled is temperature. Also preferably, the transmitter is configured to sample the environmental condition during operation of a power amplifier of the transmitter.

In one aspect, the transmitter also includes a voltage sensor and is configured to sample voltage using the voltage sensor and determine the gain correction value based on information from the environmental sensor and from the voltage sensor. In such embodiment, the transmitter preferably has an analog to digital converter connected to the environmental sensor and the voltage sensor and the baseband is configured to adjust the analog to digital converter to receive input from the environmental sensor and the voltage sensor. Preferably, the baseband communicates with the analog to digital converter using an asynchronous handshaking protocol.

Another aspect of the disclosure is directed to the transmitter being configured to determine the gain correction value by subtracting a gain correction factor, a thermal correction factor and a voltage correction factor from the desired transmit power. As noted herein, the thermal correction factor and the voltage correction factor are preferably based upon a plurality of coefficients determined for each transmit chain.

Yet another embodiment of the disclosure is directed to the transmitter being configured to have a plurality of power settings so that the adjustment of analog amplifier parameters involves switching from a first power setting to a second power setting based upon the gain correction value. Preferably, the transmitter is configured to switch from a first power setting to a second power setting when the gain correction value is greater than approximately half the difference between adjacent power settings.

BRIEF DESCRIPTION OF THE DRAWINGS

Further features and advantages will become apparent from the following and more particular description of the preferred embodiments of the invention, as illustrated in the accompanying drawing, and in which like referenced characters generally refer to the same parts or elements throughout the views, and in which.

DETAILED DESCRIPTION OF THE INVENTION

This disclosure is directed to systems and methods that provide control of transmitted signal power that do not require the use of an external power detector. By determining the expected transmit power based upon conditions such as temperature or voltage, the settings of the transmitters amplifier can be adjusted to more closely match the desired transmit power.

At the outset, it is to be understood that this disclosure is not limited to particularly exemplified materials, architectures, routines, methods or structures as such may, of course, vary. Thus, although a number of such option, similar or equivalent to those described herein, can be used in the practice of embodiments of this disclosure, the preferred materials and methods are described herein.

It is also to be understood that the terminology used herein is for the purpose of describing particular embodiments of this disclosure only and is not intended to be limiting.

Unless defined otherwise, all technical and scientific terms used herein have the same meaning as commonly understood by one having ordinary skill in the art to which the disclosure pertains.

Further, all publications, patents and patent applications cited herein, whether supra or infra, are hereby incorporated by reference in their entirety.

Finally, as used in this specification and the appended claims, the singular forms "a," "an" and "the" include plural referents unless the content clearly dictates otherwise.

As discussed above, there is a need to provide systems and methods that provide control of transmitted signal power that do not require the use of an external power detector. Since no direct information about the transmitted power is used, the techniques of this disclosure constitute an open loop power control. The performance of the analog components of the transmitter is known to vary depending upon environmental conditions such as temperature. Voltage is also known to have a significant effect on the gain of analog amplifiers. Accordingly, this disclosure is directed to sensing these environmental conditions and using that information to adjust parameters of the transmitter to achieve a transmitted signal power that is close to the desired power.

Figure 1:
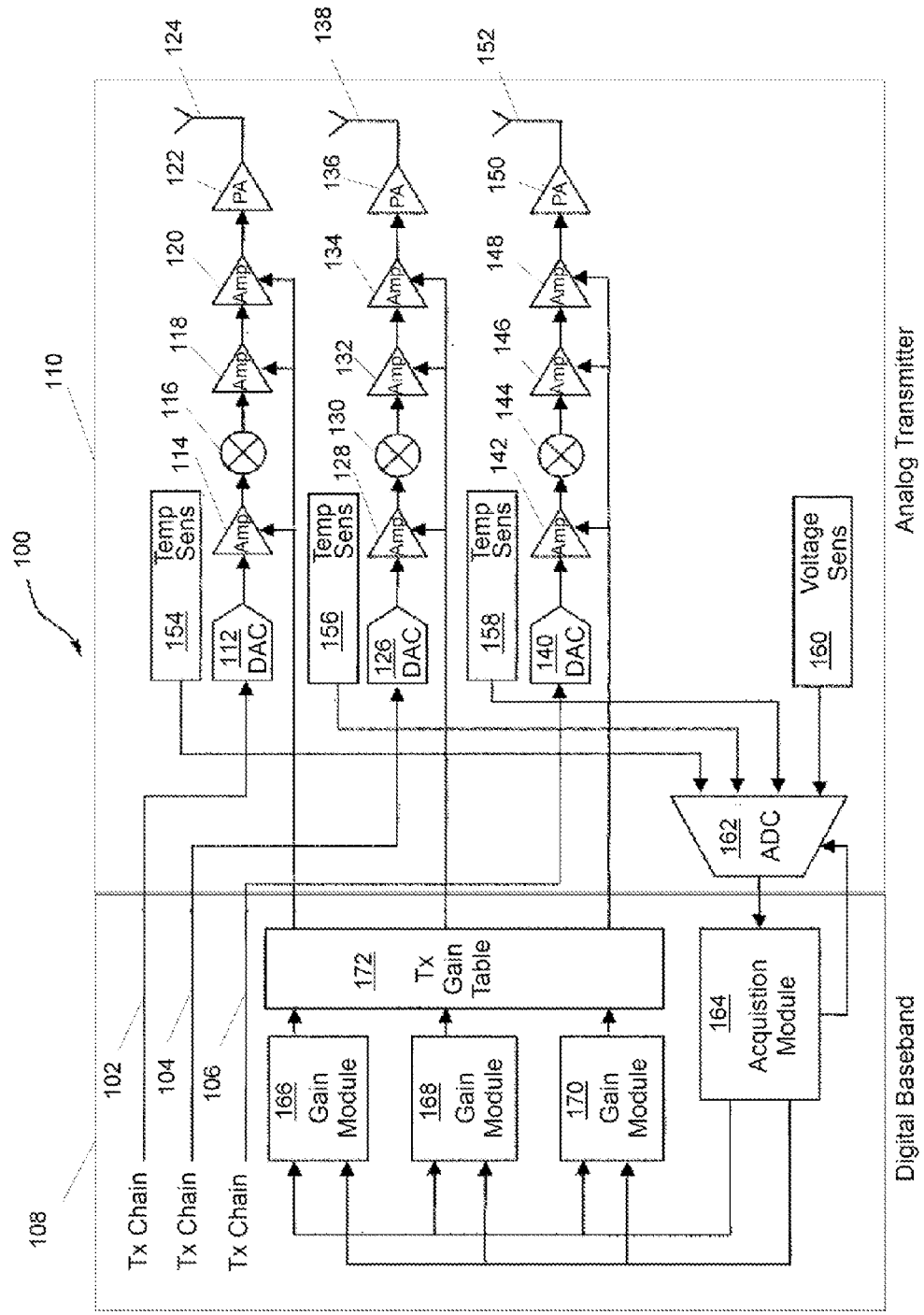
FIG. 1 is a schematic illustration of the architecture of the baseband and transmitter of a wireless communication system, according to the invention.

As shown in FIG. 1, a suitable architecture 100 for a transmitter having the open loop power control of this disclosure is shown with regard to IEEE 802.11 wireless device, although one of skill in the art will recognize that these techniques can be applied to any wireless communication system employing analog components. In the embodiment shown, three transmit chains are depicted, but one, two or more chains can be used as desired. Generally, the transmit data for each chain 102, 104 and 106 is fed from digital baseband 108 to analog transmitter 110.

With respect to chain 102, the signal is processed by digital to analog converter (DAC) 112, then subsequently fed to amplifier 114, mixer 116, amplifiers 118 and 120 and finally to power amplifier 122 before being transmitted by antenna 124. Similarly, transmit data for chain 104 is fed through DAC 126, amplifier 128, mixer 130, amplifiers 132 and 134 and power amplifier 136 to antenna 138. For chain 106, data is fed through DAC 140, amplifier 142, mixer 144, amplifiers 146 and 148 and finally power amplifier 150 for transmission by antenna 152.

Preferably, as shown, each transmit chain has an associated temperature sensor 154, 156 and 158. Generally, a single sensor is polled during the transmission of a packet. By providing an independent temperature sensor for each chain, this architecture provides the flexibility of using any combination of one or more chains to transmit data depending upon conditions and desired performance. Generally, when two or more chains are in use, only a single temperature reading from one of the associated sensors is sufficient. When only a single chain is in use, it is preferable to use the temperature sensor from that chain.

Information from temperature sensors 154, 156 and 158 along with information from voltage sensor 160 is fed to analog to digital converter (ADC) 162, which is then fed to the acquisition module 164 of the digital baseband 108. Voltage sensor 160 is preferably configured to sample the voltage being supplied to the amplifiers. Appropriate values indicating temperature and voltage are calculated and fed to desired gain modules 166, 168 and 170 that correspond to their respective transmit chains 102, 104 and 106. Information from the desired gain modules 166, 168 and 170 is then used to access the relevant portions of transmit gain table 172. Finally, the values from transmit gain table 172 are used to adjust the parameters of the amplifiers in each transmit chain so that the power amplifiers will deliver signal to the antennas that will closely match the desired signal power. For example, gain table 172 sets parameters in transmit chain 102 for amplifiers 114, 118 and 120, in transmit chain 104 for amplifiers 128, 132 and 134 and in transmit chain 106 for amplifiers 142, 146 and 148. In other embodiments, suitable gain tables can also include parameters for other components, such as power amplifiers 122, 136 and 150.

In the embodiment shown a single ADC, ADC 162 is used to sample temperature from each of the three temperature sensors and the voltage sensor. ADC 162 can also be used to sample other information, such as an analog test bus (ATB). Alternatively, multiple ADCs can be used if it is desired to sample multiple environmental conditions simultaneously, that is, during the transmission of a single packet.

As will be appreciated, the open loop power control techniques of this disclosure generally comprise environmental variable acquisition which is used to provide a desired gain calculation. The implementation of these aspects is discussed below.

Acquisition module 164 is preferably configured to control the timing of sampling temperature sensors 154, 156 and 158 and voltage sensor 160. Since ADC 162 is shared by each sensor, acquisition module 164 signals ADC 162 as to which sensor to poll. Acquisition module 164 is generally responsible for controlling when temperature is measured, how frequently the temperature is measured and how the measurements are performed.

Preferably, measurement of temperature or voltage is carried out during the transmission of a packet due to differences in the internal temperature of the chip during transmission and reception. For example, operation of power amplifiers 122, 136 and 150 generates a significant amount of heat. Accordingly, it is desirable to measure temperature when these amplifiers are turned on as this provides a more accurate representation of temperature during transmission. Acquisition module 164 sends the appropriate signal to ADC 162 to sample temperature sensors 154, 156 and 158 when the power amplifiers are operating.

The frequency of temperature measurement can be configured as desired. In one embodiment, temperature and voltage measurements can be performed alternately between successive packet transmissions. A more preferred embodiment leverages the recognition that temperature varies more often than voltage. As such, it can be desirable to sample the temperature sensors more frequently. In one implementation, programmable registers in the baseband carry values corresponding to temperature measurement frequency and voltage measurement frequency. After a system reset, temperature will be measured during the first transmit packet and voltage measured in the second transmit packet. Subsequently, temperature is measured for a number of packets corresponding to the temperature measurement frequency register value and then voltage measured for a number of packets corresponding to the voltage measurement frequency register value. This sampling pattern is then repeated until another system reset. In a preferred embodiment, the temperature measurement frequency register value corresponds to approximately 500 transmit packets and the voltage measurement frequency register value corresponds to approximately 1 transmit packet. By varying the respective values, any desired frequency of sampling of the corresponding sensors can be achieved.

In further aspects of the disclosure, other uses of temperature information can be employed. For example, if the difference between subsequent temperature readings is too great, it can be assumed there has been a sampling error. Accordingly, acquisition module 164 can be configured to hold a previous temperature value and direct ADC 162 to resample the temperature sensor. In another aspect, it may be desirable to limit or prevent operation at certain temperature thresholds. In one embodiment, acquisition module 164 is configured to shut down the transmitter or decrease the desired power as long as temperatures above the corresponding thresholds are detected.

Based on the timing and frequency register values, acquisition module 164 will signal ADC 162 to poll the corresponding sensor. ADC 162 has two possible errors which can be compensated for with calibration, a slope, or "gain," error and a dc, or "offset," error. In one implementation, a two-point calibration is performed using two reference voltages generated on chip. The corresponding ADC 162 outputs are used to calculate the gain and offset correction coefficients, which are stored in baseband registers. During operation, each ADC 162 output sample received by acquisition module 164 then can be corrected by adding the appropriate offset to the output sample and then multiplying by the appropriate gain.

In another preferred aspect of the disclosure, the interface between acquisition module 164 and ADC 162 is implemented through a simple asynchronous handshaking protocol using a start control signal from baseband to ADC and a done control signal from ADC to baseband. In this implementation, the done control signal is set high by ADC 162 following a system reset and the analog portion of ADC 162 is powered down. When acquisition module 164 seeks a sample, according to the timing and frequency considerations discussed above, it polls the done control signal. If the signal is set high, acquisition module 164 sets the start control signal to high to initiate an analog to digital conversion. Similarly, when ADC 162 receives a start control signal set to high, it sets the done control signal to low and powers up the analog portion of the ADC. Following conversion, ADC 162 outputs the sample to acquisition module 164, sets the done control signal back to high and powers down the analog portion of the ADC. As will be recognized, this asynchronous handshaking protocol simplifies the interface between the ADC and the baseband and saves power consumption by limiting the powered up state of the ADC to situations when a sample is requested. In addition, simplification and power saving benefits are realized by avoiding the need to route clock information from the baseband to ADC 162. Preferably, the ADC clock necessary for data conversion is generated in ADC 162 on demand once the start control signal triggers the ADC.

Preferably, acquisition module 164 continuously requests an output sample from ADC 162 during the transmission of a packet. Since each request generates a single ADC output sample, the final measurement preferably averages the number of ADC output samples, corrected as described above, during the transmission of a packet. Also preferably, the number of samples can be programmed and spread evenly across a transmit packet by specifying an appropriate sample interval. The averaged temperature and voltage values are stored in registers in acquisition module 164. These values are updated as appropriate during subsequent packet transmission sampling periods.

As shown in FIG. 1, the temperature and voltage information can be used by desired gain modules 166, 168 and 170 prior to the transmission of each packet to access the appropriate parameter settings from gain table 172. The parameter settings are then used to configure the analog portions of transmitter 110, including amplifiers 114, 118 and 120 in transmit chain 102, amplifiers 128, 132 and 134 in transmit chain 104 and amplifiers 142, 146 and 148 in transmit chain 106, depending upon which chain is being transmitted. Following configuration, the packet is transmitted. Thus, in this implementation, the temperature and voltage measurements used to determine the desired gain are obtained during the transmission of previous packets. During the transmission of the current packet, new temperature or voltage information is sampled and stored by acquisition module 164 as described above for use in subsequent packet transmissions.

As will be appreciated, this configuration does not provide temperature or voltage information during the transmission of the first two packets following a system reset, since that information is in the process of being acquired. Accordingly, initial estimated values or legacy values can be used for temperature and voltage during transmission of the first packet while temperature is being sampled. For transmission of the second packet, the sampled temperature information can be used, so only the initial voltage value is used to determine the desired gain. Depending upon the configuration, the choice of initial values can be selected to avoid FCC violations by transmitting at conservatively lower signal powers or to use temperature or voltage information obtained during a previous operation cycle.

The desired gain calculations performed by modules 166, 168 and 170 are configured to correct for the expected deviations in performance of the analog components of the transmitter due to environmental factors such as temperature and voltage as described above. During characterization for manufacture, a number of correction factors can be determined that will vary for each transmitter. Generally, the correction factors will be determined at a reference temperature and voltage, which can then be used to correlate with expected performance at the measured temperature and voltage. For example, an open loop gain delta value is determined by measuring actual signal power at the reference temperature and voltage. The open loop gain delta is channel frequency dependent and transmit chain dependent, thus the calibration is preferably performed for each chain at each channel frequency. These values are then stored in tables in the desired gain modules.

Other correction parameters can be determined during lab characterizations using the hardware that will be used in manufacture. For example, thermal and voltage correlation values are determined on the assumption of a linear relationship between temperature or voltage and the respective correction value and that an absolute reference value is not required. Depending upon the desired level of performance, these correlation values can be determined independently for each transmitter at a plurality of frequencies. Alternatively, a common value can be used in the desired gain calculations for each transmit chain. Using the correlation values, a thermal gain correction value is determined by multiplying the difference between the reference temperature used for calibration and the latest sampled temperature by the thermal correlation value. Similarly, a voltage gain correction value is determined by multiplying the difference between the reference voltage used for calibration and the latest sampled voltage by the voltage correlation value.

Suitable formulae for applying the algorithms of this disclosure are:

desired gain=target_power−$olpc$_gain_delta−$therm$_ gain_$corr$−volt_gain−$corr$ $therm$_gain_$corr$=alpha_$therm$×(latest_$therm$_ value−$therm$_$cal$_value)

volt_gain_$corr$=alpha_volt×(latest_volt_value−volt_ $cal$_value)

In the above equations, "target_power" is the expected target transmit power specified by software. It will be recognized that different MCS (Modulation and Coding Scheme) values could have different target powers, all controlled by the software. The "desired gain" calculations for all transmit chains use the same "target_power." "Olpc_gain_delta" is a correction factor calculated during TPC manufacturing calibration and is channel frequency dependent and transmit chain dependent, thus calibration is preferably performed for each chain and each channel frequency. "Therm_cal_value" and "volt_cal_value" are the temperature and voltage reading when manufacturing calibration is carried out, so all transmit chains have the same "therm_cal_value" and the same "volt_ cal_value." "Alpha_therm" is a coefficient that approximates the relationship between temperature change and gain change, resulting in a linear response and assuming no absolute temperature reference. Finally, "alpha_volt" is a coefficient that approximates the relationship between voltage change and gain change, also resulting in a linear response and assuming no absolute temperature reference. The "alpha_therm" and "alpha_volt" values, are obtained during lab characterization. In one embodiment, the values are determined once and applied to all transmit chains and chips. Alternatively, separate measurements can be performed for the separate transmit chains and at a plurality of frequencies to improve the estimations.

As discussed above, the open loop gain delta value and thermal and voltage correction values are used to determine the appropriate desired gain values. Specifically, the desired gain value is obtained by subtracting the open loop gain delta value, the thermal gain correction value and the voltage gain correction value from the desired signal power. The desired signal power is generally specified by software programming in baseband 108. For example, different MCSs can have different desired signal powers, all of which can be controlled by the appropriate software. In another example, multipath simulations indicate that the required transmission error vector magnitude (EVM) increases with the number of chains employed. Since EVM depends upon the desired signal power, this factor can be compensated when determining the desired gain values. The desired gain calculations for all transmit chains generally will all use the same desired signal power target.

In another implementation, a digital scaling value is also determined. The digital scaling value corresponds to the gain associated with the use of DACs 112, 126 and 140. The desired gain calculation generally adds this digital scaling value to the desired signal power, while the open loop gain delta value, the thermal gain correction value and the voltage gain correction value are subtracted.

In another embodiment of the disclosure, the transmitter supports modes where linearization is optionally performed on the power amplifiers (PAL). Although linearization is generally desirable, PAL might be turned off for Direct Sequence Spread-Spectrum Complementary Code Keying DSSS/CCK rates and other Orthogonal Frequency Division Multiplexing (OFDM) rates. Since PAL affects the transmit power, values for the open loop gain delta are determined with PAL on and off, and those values are then applied during the calculation of the desired gain value depending upon the PAL state.

Figure 2:
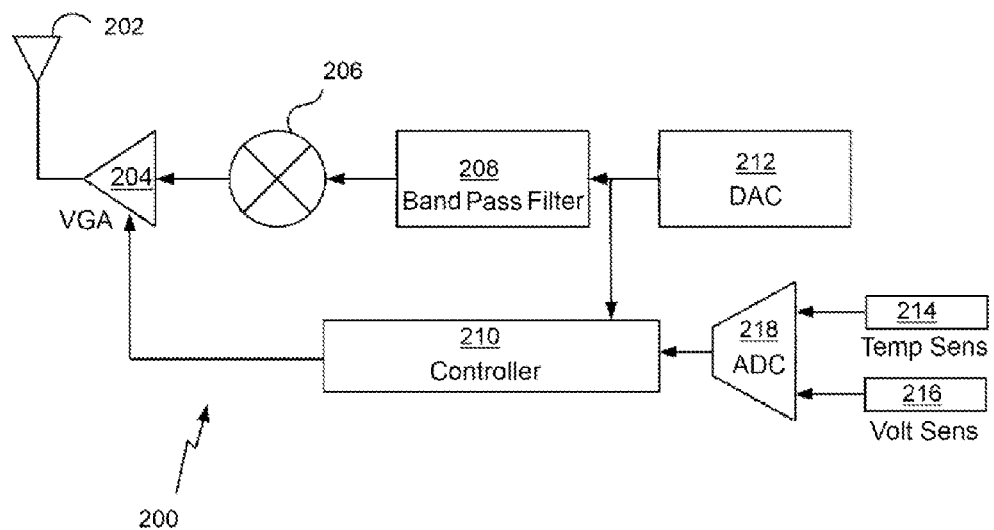
FIG. 2 is a schematic illustration of the architecture of the baseband and transmitter of a Bluetooth communication system, according to the invention.

In yet another aspect of the disclosure, the open loop power control techniques are used to adjust the power of a Bluetooth transmitter based upon desired signal power and an environmental condition such as temperature. FIG. 2 illustrates a block diagram of a Bluetooth transmitter 200, configured to provide open loop power control using the techniques described in this disclosure. Bluetooth transmitter 200 includes an antenna 202, a variable gain amplifier (VGA) 204, a mixer 206, a band-pass filter 208, a controller 210 and digital to analog converters (DAC) 212. Temperature sensor 214 and voltage sensor 216 are sampled by ADC 218 which feeds the information to controller 210.

A typical Bluetooth transmit chain involves the signal from DAC 212 being fed to band-pass filter 208 and then mixer 206. As described in greater detail below, controller 210 utilizes information from temperature sensor 214 and voltage sensor 216 to set a desired transmit power. Controller 210 adjusts the setting of VGA 204 so that the signal transmitted by antenna 202 will closely approximate the desired transmit power.

Bluetooth signals occupy the 2401 through 2481 MHz range of frequencies. Bluetooth devices use frequency hopping as a form of a multiple access scheme. Each frequency band is 1 MHz wide and is used by users for a predetermined amount of time. Bluetooth versions 2.0 and 2.1 also specify enhanced data rates (EDR) using phase-shift keying (PSK) modulation schemes to support 2 Mbs and 3 Mbs of data throughput. The basic framework of the Bluetooth transmitter shown in FIG. 2 can be suitably modified to accommodate these modulation schemes.

The temperature sensitivity of the analog components of a Bluetooth transmitter is shown in Tables 1 and 2, which compare performance in normal mode (Table 1) and high power mode (Table 2). As can be seen, there is approximately 1-2 dB increase in signal power when going from room temperature to cold and approximately 0.5-1 dB reduction when going from room temperature to high temperature.

TABLE 1

| RF Test Metric | −40° C. | 25° C. | 85° C. | Passing Criteria |
| --- | --- | --- | --- | --- |
| TX Output Power (dBm) | 3.9 | 2.5 | 2.0 | |
| 3 Mbps Avg DEVM | 0.06 | 0.05 | 0.05 | <.13 |
| 3 Mbps Peak DEVM | 0.18 | 0.17 | 0.16 | <.25 |
| Worst Case ACP +/− 3 MHz offset (dBm) | −40.66 | −41.3 | | <−40 dBm |

TABLE 2

| RF Test Metric | −40° C. | 25° C. | 85° C. | Passing Criteria |
| --- | --- | --- | --- | --- |
| TX Output Power (dBm) | 7.6 | 6.9 | 6.1 | |
| 3 Mbps Avg DEVM | 0.11 | 0.05 | 0.05 | <.13 |
| 3 Mbps Peak DEVM | 0.30 | 0.15 | 0.16 | <.25 |
| Worst Case ACP +/− 3 MHz offset (dBm) | −39.8 | −40.18 | −41.3 | <−40 dBm |

Generally, it is preferable to have higher transmission power as this will improve signal reception over greater distances. However, as discussed above, higher transmission power can also degrade performance metrics such as EVM and ACP. For example, Tables 1 and 2 illustrate that decreasing temperatures undesirably increase the EVM and ACP. Indeed, as shown in Table 2, at low temperatures, Peak DEVM and ACP fail to meet the corresponding criteria. Thus, using at least two gain tables allows relatively lower transmission powers to be set at low temperatures and relatively higher transmission powers to be set at higher temperatures. As a result, performance can be maximized with the higher transmit powers at higher temperatures while meeting the performance criteria at lower temperatures.

Accordingly, the transmitter preferably has two gain tables, a high power table containing settings that are applied when the temperature is at room temperature and above, and a normal power table containing settings that are applied when the temperature is below room temperature. As will be appreciated, the criteria for choosing which table to apply is completely configurable in order to achieve the desired performance. For example, in one embodiment, the normal gain table is used at cold temperatures below the range of 0-10° C., such as below 0° C., and the high gain table is used at temperatures above the cold range, including room temperature, such as 20-25° C., and high temperatures, such as 40-50° C. Furthermore, one or more additional gain tables can be added to increase the number of levels available to tailor the transmission power.

In one embodiment, a suitable Bluetooth transmitter is controlled digitally in 0.5 dB increments by setting the linear gain parameter, which is analog, and the DAC gain parameter, which is digital. An on-chip thermometer, or temperature sensor, provides a reading that represents the temperature of the chip. Preferably, the temperature sensor has a resolution of at least approximately 3 degrees Celsius. Further, as discussed above, the Bluetooth transmitter offers two transmit power modes, normal and high power. The high power modes can transmit power up to approximately 6-7 dBm and the normal mode is transmits at approximately 2-3 dBm. In high power mode, there is an option to configure the synthesizer in a "doubler" mode, where the input reference crystal frequency is doubled. This allows for the shaping of the phase noise characteristics of the synthesizer to allow for more headroom in EVM and ACP performance metrics.

Figure 3:
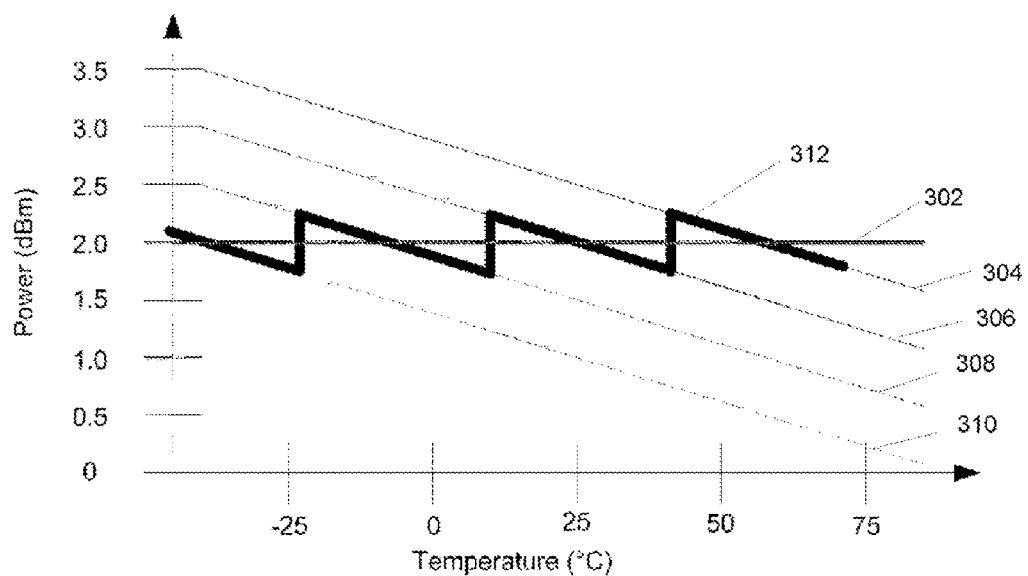
FIG. 3 is a graphical representation of a transmit power profile related to temperature, according to the invention.

By employing the open loop power control techniques of this disclosure, the transmit power of the Bluetooth transmitter can be held substantially constant as the environmental temperature varies. In general, this includes adjusting the transmit power settings when the transmit power is expected to vary by more that approximately 0.25 dB (half the resolution available) from the desired transmit power. As shown in FIG. 3, this is achieved by stepping up or down to adjacent power settings as the temperature changes. The desired transmit power 302 is 2 dB. Expected transmit powers 304, 306, 308 and 310 are spaced at 0.5 dB intervals, vary with temperature, and are associated with specific power settings. By changing the power setting when the expected transmit power increases or decreases by more than 0.25 dB from the desired 2 dBm level, actual transmit power 312 approximates the steady 2 dBm of desired transmit power 302.

Assuming a linear relationship for a given set of gain table settings, the transmit power at a given temperature equals a temperature correction factor multiplied by the temperature, plus a calibration offset. As with the other embodiments of this disclosure, the correction factor and calibration offset can be determined during lab testing and characterization. Preferably, these values are determined using a least squares fit to measurement data.

In the implementations discussed above, the power settings for the transmitter have a 0.5 dB resolution. Accordingly, the power setting is adjusted when the expected transmit power exhibits a variation of more than half the resolution, or a variation of more than 0.25 dB. Stated another way, a gain correction value represents the difference between the expected transmit power, as determined using characterization data for various gain settings and readings from the temperature sensor, and the desired transmit power. When the gain correction value exceeds a threshold, such as half the resolution of the power settings in the noted embodiment, the appropriate adjacent power setting is selected.

As will be appreciated, these values are representative only and may be adjusted depending upon the specific transmitters being used, the environmental conditions, the desired performance or other suitable criteria. Thus greater or less resolution in the step sizes of the power settings can be employed and depending upon the application, preferred spacings between adjacent power settings are in the range of approximately 0.1 dB to 2 dB. While it is generally preferable to adjust the power setting when the expected transmit power exhibits a variation of more than one half the step size, other inflection points can be used as discussed below. Similarly, although the temperature sensor discussed above has a resolution of approximately 3° C., a sensor having either more or less precision can be used depending upon the desired performance, expected conditions and other design parameters.

Accordingly, a currently preferred embodiment is directed to adjusting the power setting when the expected transmit power varies by more than half the resolution of the power settings. In alternative embodiments, the step of adjusting the power settings can be biased to either relatively higher or lower transmit powers by changing the inflection point from midway between the adjacent power settings. For example, a low transmit power bias can be implemented by adjusting the power setting down when the expected transmit power is a suitable percentage less than 50, such as 25%, greater than the desired transmit power. Correspondingly, the power setting is adjusted up when the expected transmit power is less than the complementary percentage, such as 75% in this example, of the desired transmit power. Similarly, a high transmit power bias can be implemented by adjusting the power setting up when the expected transmit power is a suitable percentage greater than 50, such as 75%, greater than the desired transmit power.

Figure 4:
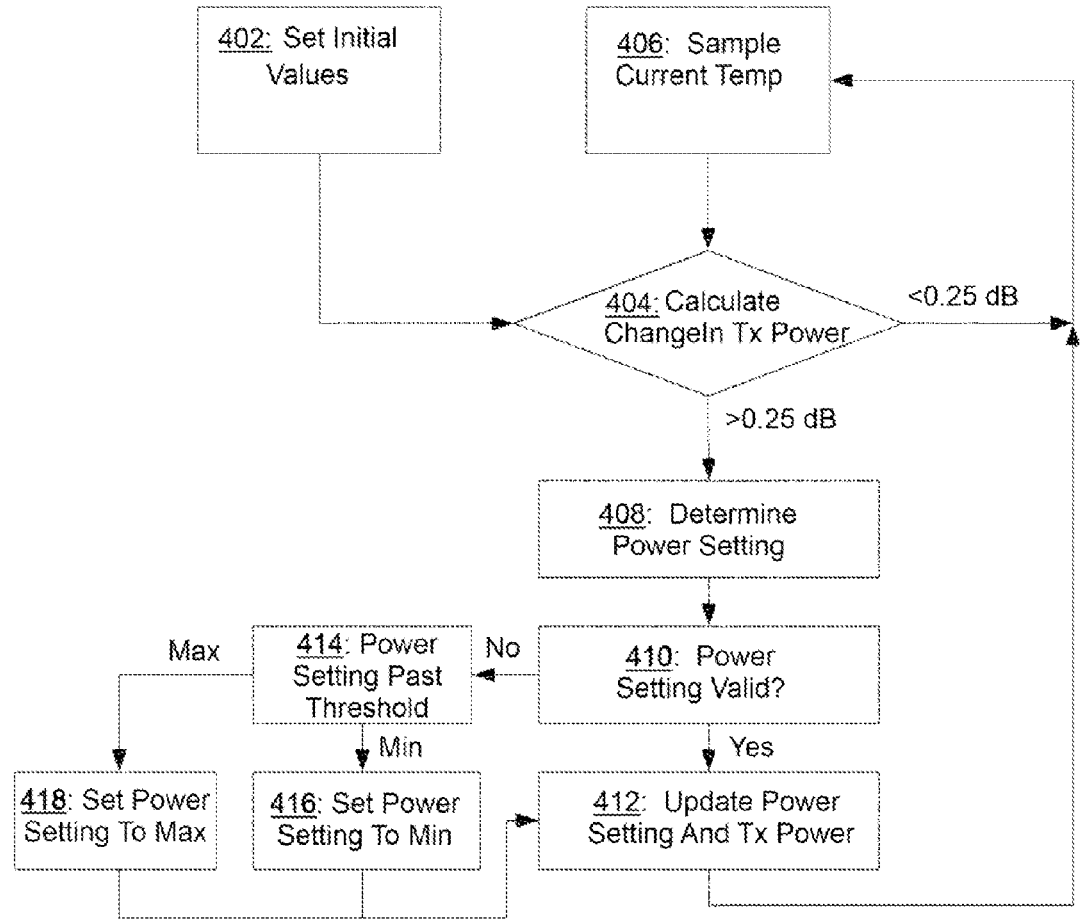
FIG. 4 is a flowchart representing a process for controlling transmit power, according to the invention.

Another aspect of the disclosure involves the introduction of hysteresis into the power setting adjustment process. In situations when it would not be desirable to cause too many fluctuations in the power setting, a delay can be introduced to prevent switching between power settings for a given period of time FIG. 4 is a flow chart representing the steps performed in adjusting the power settings to maintain a desired transmit signal power. In block 402, registers corresponding to the desired transmit power, the power setting and temperature are supplied with suitable initial values as described above. In block 404, the change in transmit power is calculated using the current temperature. If the change in transmit power is less than or equal to 0.25 dB, the process moves to block 406 in which the power setting is unchanged, the transmit power is unchanged and the current temperature is sampled. This returns to block 404, so that change in transmit power can be recalculated. When the change in transmit power is greater than 0.25 dB, the relevant power setting is determined in block 408. Since each successive power setting correlates to a 0.5 dB change in transmit power, the relative power setting can be determined by dividing the change in transmit power by 0.5. In block 410, it is determined whether the relative power setting established in block 408 is valid. When the power setting established in block 408 is valid, the process goes to block 412 where the register values corresponding to the power setting and the transmit power are updated and then subsequently to block 406 to restart the process by resampling the temperature. Conversely, in step 414, the threshold for either the minimum or maximum power setting has been reached. If the relative power setting established in block 408 is less than the minimum setting, then the power setting is set at the minimum in block 416 and the process goes to block 412 to set the corresponding register values. On the other hand, if the relative power setting established in block 408 is greater than the minimum, and since it has been determined not to be valid, it must be greater than the maximum power setting. Accordingly, the power setting is set to maximum in block 418 and the process goes to block 412 to set the register values.

Preferably, the power setting established in this process is then correlated to appropriate values for the analog and digital gains, which can be stored in a lookup table. As will be appreciated, the appropriate parameters of the analog and digital gains in the lookup table can be set to optimize desired performance characteristics of the transmitter. For example, the table can be optimized for power consumption to preserve battery life.

In a further aspect, the algorithm indicated in FIG. 4 can be extended to include Bluetooth high power mode transmission. To accommodate this feature, a corresponding high power correction factor and calibration offset and a high power gain table are determined and stored. In addition, the default high power setting at room temperature (25° C.) can be used for an initial value. Since it is desirable to switch to normal power mode when lower transmit powers are indicated to reduce power consumption, the high power gain table requires fewer entries than the normal power gain table.

In another aspect of the disclosure, the procedures for controlling transmit power based upon sensed environmental conditions, such as temperature, can be extended to incorporate information about the performance of the devices obtained during the different design and manufacturing stages. As known to those of skill in the art, the specific operating characteristics of a wireless transmitter utilizing the open loop power control schemes disclosed herein can be subject to certain degrees of variability. For example, much of the necessary circuitry for the wireless transceiver, together with other electronics, will often be contained on a single integrated circuit. Small changes in manufacturing conditions may be unavoidable and inherent variability between batches of silicon wafers lead to differences in operation that can affect the wireless performance. Similarly, once the integrated circuit is incorporated into a device, the variations and tolerances of associated components also influence the performance of the wireless device, as do the other manufacturing conditions, such soldering quality. By testing the components of the wireless device at various stages of manufacture, the actual performance of the components can be assessed and data reflecting that performance can be used to calibrate the algorithms used to establish the power settings employed to achieve the desired transmit power.

At a first level, data gathering can be performed on a suitable batch of reference printed circuit board designs. Depending upon the potential for variation, it is desirable to test a sufficient number of instances of the design to ensure that the results are statistically significant, such as one hundred or more. The actual transmit power of each board is measured on a number of channels at a fixed gain setting. In one embodiment, the transmit power on 3 to 5 channels is measured. The average actual transmit power across the sample is determined and used to calibrate the power setting to the transmit power. This information can then be applied to an entire manufacturing run. Using this technique, transmit power control accuracy across the frequency band can be +/−2 dB without requiring additional calibration during manufacture.

A second level of calibration can be obtained by building upon the above technique. The pre-characterization of a sufficiently large sample is performed and the average transmit power at various channels for a fixed gain setting is obtained as described above. However, in addition to this information, data from the automated test equipment (ATE) during wafer manufacture is obtained and used to refine the characterization of transmit power at given gain settings. As will be appreciated, the information developed during ATE applies to each die obtained from the wafer. Preferably, the necessary information is incorporated into each chip. Then, after the chip is incorporated into a device, then information can be accessed and used to refine the transmit power settings. In a preferred embodiment, the ATE calibration information can be stored in the one time program (OTP) area of the chip.

In yet a third level, the calibration information is obtained from the final manufactured product. By testing the transmit power of the finished device, the gain settings necessary to achieve the desired transmit power can be closely calibrated. Preferably, the actual transmit power is measured at several channels across the frequency band. This technique imparts the most cost, since each individual device undergoes calibration, but it also provides the most accurate results.

The following example is representative of the second level of calibration, but should not be considered limiting as it illustrates only one possible approach. Calibration values determined during ATE are stored on each integrated circuit so that during operation of the device, software can read the calibration values and adjust the gain settings using the open loop power control techniques discussed above. As will be appreciated, the ATE calibration also provides parameters for the software to generate thermal ADC scaled gain and offset, to generate a more accurate chip thermal reading.

Specifically, thermal ADC scaled gain (Kg) and offset (Ko), in which System_thermal_value=Kg*ATE_thermal_value+Ko, can be determined by calibration during ATE using two known test voltages, vtestL and vtestH (nominal 150 mV and 450 mV), using the following calculations:

$$Ko = \text{ideal } adc\_out \text{ for } vtestL - \text{measured } adc\_out \text{ for } vtestL.$$

$$Kg = (\text{ideal } adc\_out \text{ for } vtestH - \text{ideal } adc\_out \text{ for } vtestL)*256/(\text{measured } adc\_out \text{ for } vtestH - \text{measured } adc\_out \text{ for } vtestL)$$

and $$adc\_out = 192/300 \text{ mv} * adc\_in(mv) - 80,$$

in which $$codeL = \text{measured } adc\_out \text{ for } vtestL@ATE$$

$$codeH = \text{measured } adc\_out \text{ for } vtestH@ATE$$

$$vtestL = \text{low test voltage}@ATE$$

and
vtestH=high test voltage @ ATE. Preferably, these four values are stored on each chip, in OTP for example, for use by the device's software during operation to refine the power setting determinations. After employing a conversion factor to account for unit differences, suitable equations for determining thermal gain and offset in software are:

$$Ko = 0.536 * vtestL - codeL - 80$$

$$Kg = 0.536 * 256 * (vtestH - vtestL)/(codeH - codeL)$$

Thus, baseline performance for a given device is established during lab testing using a single reference. Values including transmit power at various transmission gain settings at different channels and thermal value are stored and used as reference by the devices in the production run. ATE testing of subsets of a production run determine additional correction factors, such as the thermal gain and offset as described above, which are preferably stored on each chip. In one embodiment, the production subset corresponds to the dies produced from a single silicon wafer and the correction factors are stored in each die from the tested wafer.

Described herein are presently preferred embodiments. However, one skilled in the art that pertains to the present invention will understand that the principles of this disclosure can be extended easily with appropriate modifications to other applications. For example, although the embodiments discussed above are directed to 802.11 and Bluetooth based wireless systems, transmitters configured for other wireless systems or for wired systems such as power line carriers are within the scope of the invention.

What is claimed is:

1. A method for controlling transmit power in a transmitter comprising:

providing a transmitter having a digital baseband portion including an analog amplifier, an environmental sensor, and a voltage sensor configured to determine a voltage supplied to the analog amplifier;

sampling a condition with the environmental sensor;

sampling a voltage with the voltage sensor;

determining a gain correction value to achieve a desired transmit power based at least in part on information from the environmental sensor and the voltage sensor;

adjusting a parameter of the analog amplifier using the gain correction value; and transmitting a signal using the adjusted parameter of the analog amplifier.

2. The method of claim 1, wherein the environmental condition sampled is temperature.

3. The method of claim 1, wherein the transmitter further comprises an analog to digital converter coupled to the environmental sensor and the voltage sensor and wherein sampling the condition and the voltage comprise the digital baseband portion configuring the analog to digital converter to receive input from the environmental sensor and the voltage sensor.

4. The method of claim 3, wherein the digital baseband portion communicates with the analog to digital converter using an asynchronous handshaking protocol.

5. The method of claim 1, wherein determining a gain correction value comprises subtracting at least one of a gain correction factor, an environmental correction factor and a voltage correction factor from the desired transmit power.

6. The method of claim 5 wherein the environmental correction factor and the voltage correction factor are based at least in part on a plurality of coefficients determined for each transmit chain.

7. The method of claim 1, wherein sampling the environmental condition occurs during operation of a power amplifier of the transmitter.

8. The method of claim 1, wherein the transmitter is configured to have a plurality of power settings and wherein adjusting the parameter of the analog amplifier comprises switching from a first power setting to a second power setting based upon the gain correction value.

9. The method of claim 8, wherein switching from a first power setting to a second power setting occurs when the gain correction value is greater than approximately half of a difference between adjacent power settings.

10. A transmitter comprising a digital baseband portion including an analog amplifier, an environmental sensor, and a voltage sensor configured to determine a voltage supplied to the analog amplifier; wherein the transmitter is configured to:

sample a condition with the environmental sensor, sample a voltage with the voltage sensor, determine a gain correction value to achieve a desired transmit power based at least in part on information from the environmental sensor and the voltage sensor, adjust a parameter of the analog amplifier using the gain correction value, and transmit a signal using the adjusted parameter of the analog amplifier.

11. The transmitter of claim 10, wherein the condition sampled is temperature.

12. The transmitter of claim 10, wherein the transmitter further comprises an analog to digital converter coupled to the environmental sensor and the voltage sensor and wherein the digital baseband portion is configured to adjust the analog to digital converter to receive input from the environmental sensor and the voltage sensor.

13. The transmitter of claim 12, wherein the digital baseband portion communicates with the analog to digital converter using an asynchronous handshaking protocol.

14. The transmitter of claim 10, wherein the transmitter is configured to determine the gain correction value by subtracting at least one of a gain correction factor, an environmental correction factor and a voltage correction factor from the desired transmit power.

15. The transmitter of claim 14 wherein the environmental correction factor and the voltage correction factor are based at least in part on a plurality of coefficients determined for each transmit chain.

16. The transmitter of claim 10, wherein the transmitter is configured to sample the environmental condition during operation of a power amplifier of the transmitter.

17. The transmitter of claim 10, wherein the transmitter is configured to have a plurality of power settings and adjusts the parameter of the analog amplifier by switching from a first power setting to a second power setting based at least in part on the gain correction value.

18. The transmitter of claim 17, wherein the transmitter is configured to switch from a first power setting to a second power setting when the gain correction value is greater than approximately half of a difference between adjacent power settings.

19. The transmitter of claim 10, wherein the transmitter further comprises a plurality of transmit chains and each transmit chain has an environmental sensor.

20. The transmitter of claim 10, wherein the transmitter is configured to adjusts the parameter of the analog amplifier on a per packet basis.

21. The method of claim 1, wherein adjusting the parameter of the analog amplifier is performed on a per packet basis.

* * * * *